United States Patent
Lee et al.

(10) Patent No.: US 11,234,335 B2
(45) Date of Patent: Jan. 25, 2022

(54) FIXING STRUCTURE AND REMOTE CONTROL DEVICE USING THE SAME

(71) Applicant: Goldtek Technology Co., Ltd., New Taipei (TW)

(72) Inventors: Lih-Sin Lee, Taipei (TW); Tzu-Kuei Wang, New Taipei (TW)

(73) Assignee: Goldtek Technology Co., Ltd., New Taipei (TW)

( * ) Notice: Subject to any disclaimer, the term of this patent is extended or adjusted under 35 U.S.C. 154(b) by 0 days.

(21) Appl. No.: 16/984,529

(22) Filed: Aug. 4, 2020

(65) Prior Publication Data

US 2021/0127504 A1    Apr. 29, 2021

(30) Foreign Application Priority Data

Oct. 29, 2019 (TW) ................... 108139097

(51) Int. Cl.
H05K 5/00 (2006.01)
H05K 5/02 (2006.01)
G08C 17/00 (2006.01)
H05K 5/03 (2006.01)
H05K 7/14 (2006.01)

(52) U.S. Cl.
CPC .......... *H05K 5/0004* (2013.01); *G08C 17/00* (2013.01); *H05K 5/0217* (2013.01); *H05K 5/03* (2013.01); *H05K 7/1427* (2013.01)

(58) Field of Classification Search
USPC ........................................... 361/752
See application file for complete search history.

(56) References Cited

U.S. PATENT DOCUMENTS

| | | | | |
|---|---|---|---|---|
| 5,438,482 A * | 8/1995 | Nakamura | ........... | H04B 1/3833 174/371 |
| 5,920,459 A * | 7/1999 | Weber | ........... | H05K 5/006 361/752 |
| 6,249,442 B1 * | 6/2001 | Watanabe | ........... | H05K 7/142 174/138 E |
| 7,394,661 B2 * | 7/2008 | Wang | ........... | H05K 1/182 174/50.52 |
| 8,062,054 B2 * | 11/2011 | Su | ........... | H01R 13/648 439/362 |
| 2003/0186570 A1 * | 10/2003 | Ito | ........... | G06K 7/0073 439/79 |

* cited by examiner

*Primary Examiner* — Hung S. Bui
(74) *Attorney, Agent, or Firm* — ScienBiziP, P.C.

(57) ABSTRACT

A fixing structure includes an upper cover and a lower cover. The lower cover includes a first bottom plate and a first side wall. The first side wall is disposed around the edge of the first bottom plate. The first side wall includes a first step. The first step is disposed at an end of the first side wall away from the first bottom plate. The first step includes a first protrusion and a first recess. The first recess is adjacent to the first protrusion. The upper cover includes a second bottom plate and a second side wall. The second side wall is disposed around the edge of the second bottom plate. The second side wall includes a second step which is disposed at an end of the second side wall away from the second bottom plate. The present disclosure also provides a remote control device using the same.

4 Claims, 4 Drawing Sheets

FIXING STRUCTURE AND REMOTE CONTROL DEVICE USING THE SAME

FIELD

The subject matter relates to a fixing structure and a remote control device using the same.

BACKGROUND

In the related art, a fixing structure is usually fixed using locking screws. A user must use tools to disassemble the fixing structure and the disassembly process is difficult to perform. There are also some traditional fixing structures that are fixed by means of snaps, which is also hard to remove.

Therefore, there is room for improvement in the art.

BRIEF DESCRIPTION OF THE DRAWINGS

Implementations of the present disclosure will now be described, by way of embodiments only, with reference to the attached figures.

DETAILED DESCRIPTION

Figure 1:
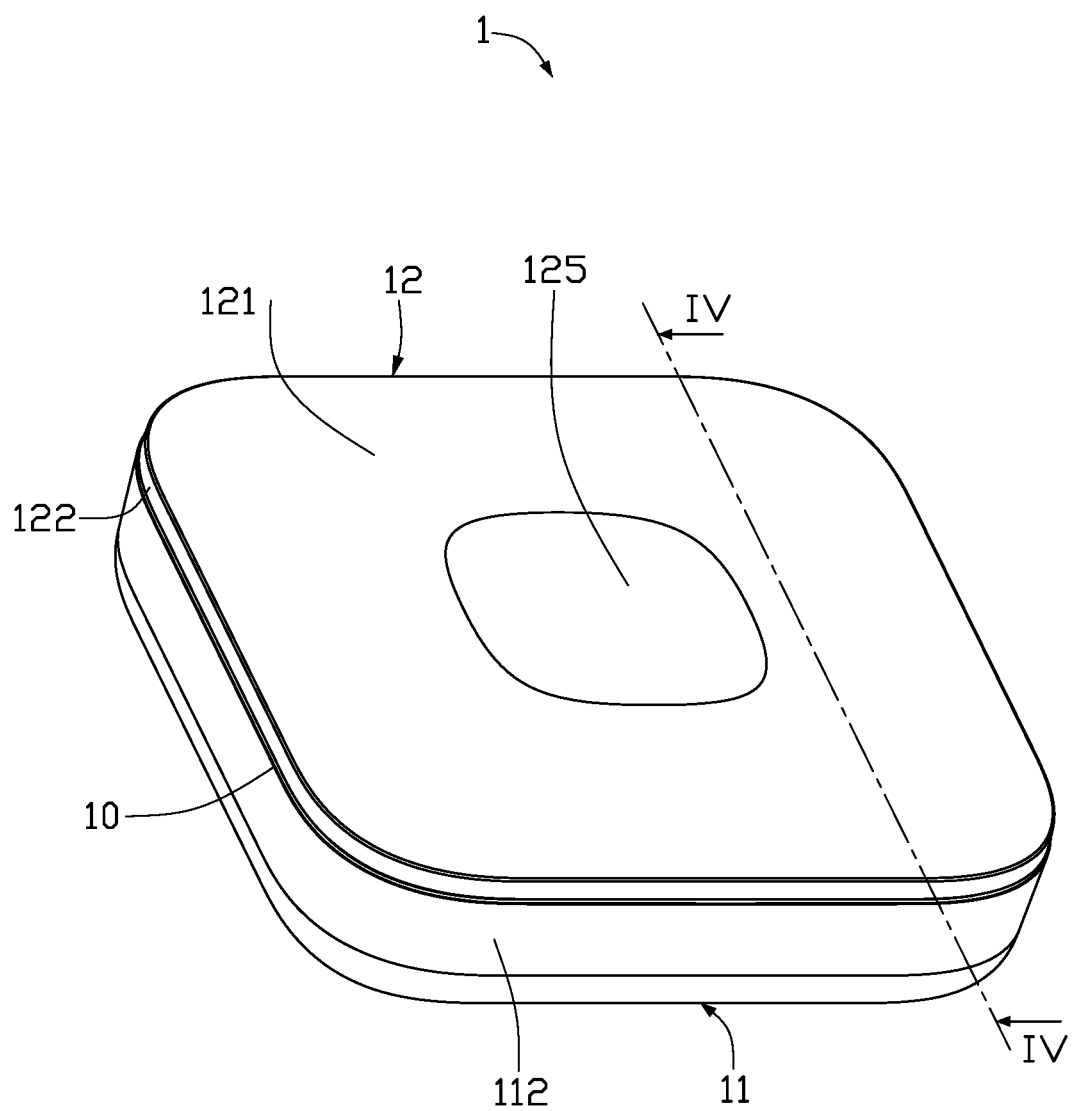
FIG. 1 is a perspective view of a remote control device.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
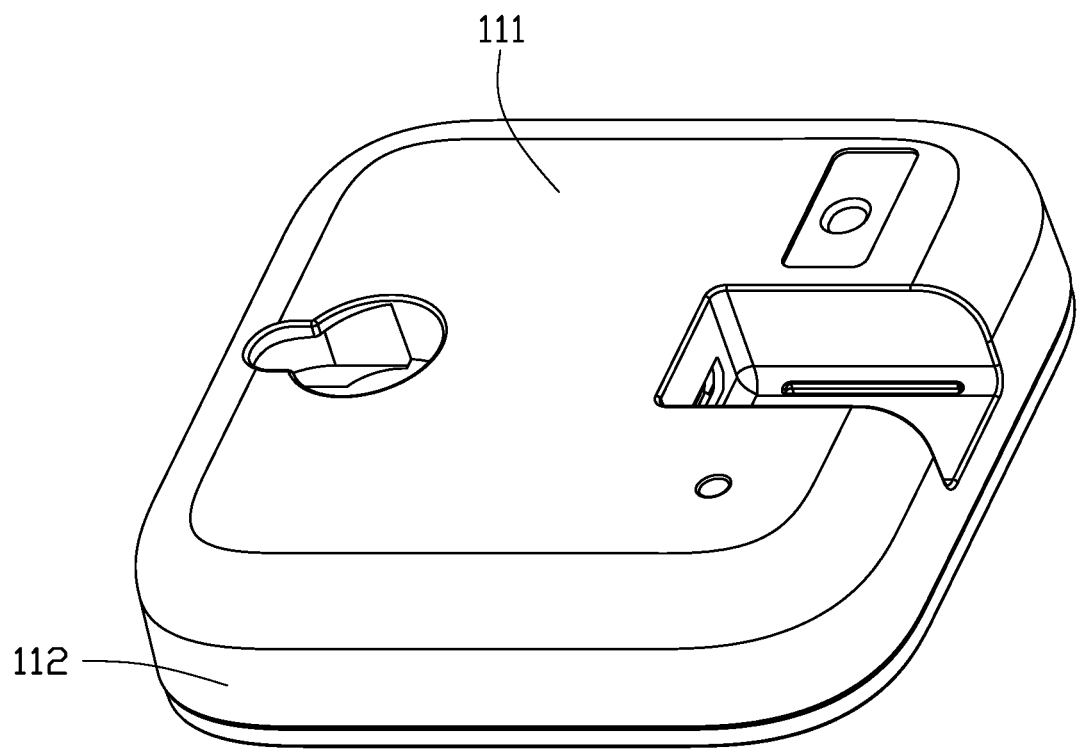
FIG. 2 is a perspective view from another angle of the same remote control device as the FIG. 1.
Figure 3:
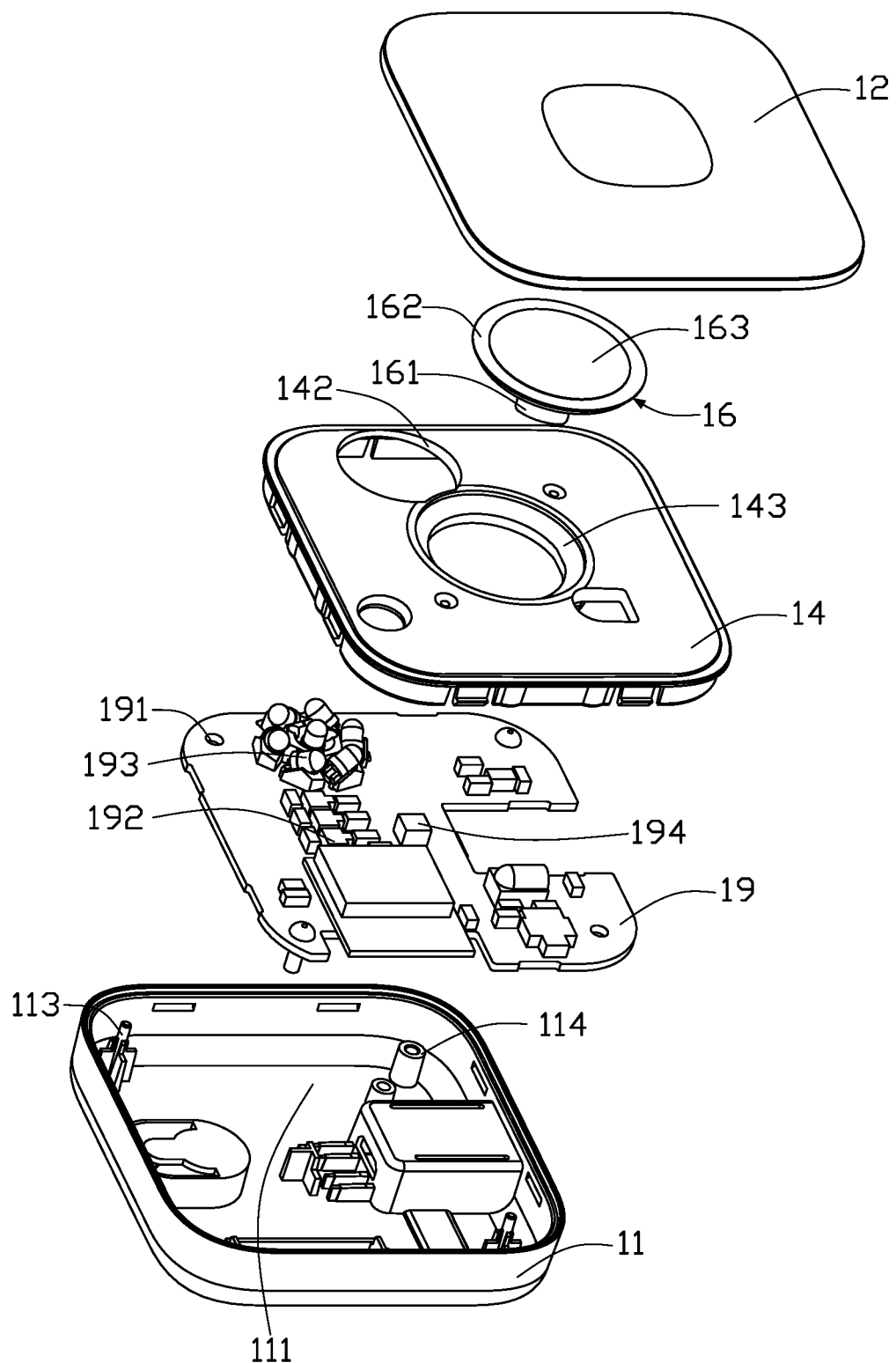
FIG. 3 is an exploded view of the remote control device of FIG. 1 and FIG. 2.
Figure 4:
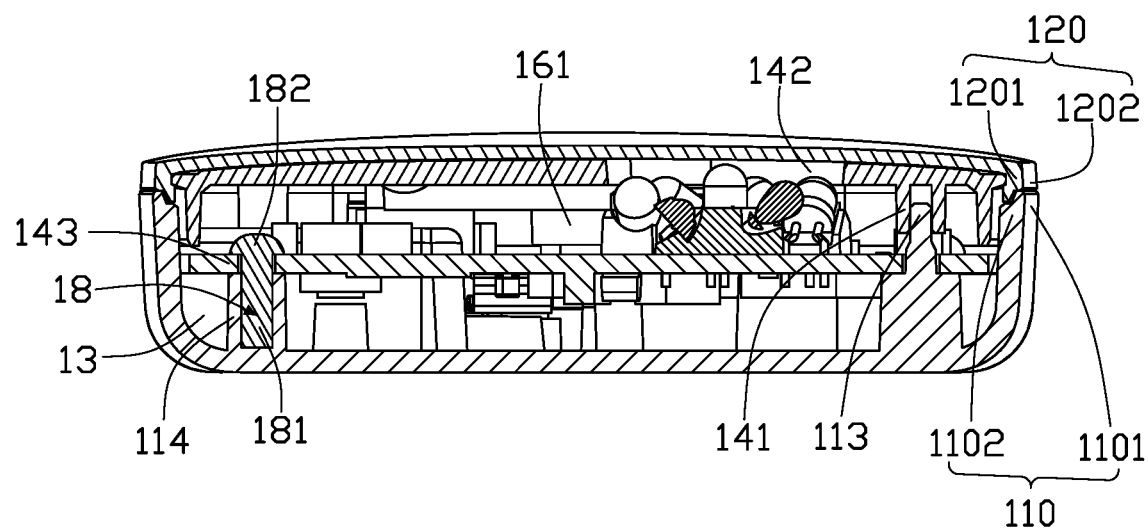
FIG. 4 is a cross-sectional view along line IV-IV of FIG. 1.

As shown in FIGS. 1 to 4, a remote control device 1 includes a fixing structure 10 and a function board 19. The fixing structure 10 includes a lower cover 11 and an upper cover 12. The upper cover 12 is engaged with the lower cover 11 to form an accommodating cavity 13.

The lower cover 11 includes a first bottom plate 111 and a first side wall 112. The first side wall 112 surrounds an edge of the first bottom plate 111. The first side wall 112 includes a first step 110. The first step 110 is disposed at an end of the first side wall 112 away from the first bottom plate 111. The first step 110 includes a first protrusion 1101 and a first recess 1102. The first recess 1102 is adjacent to the first protrusion 1101. The first side wall 112 may be surrounded and formed by a plurality of sub-side walls connected in sequence. The first side wall 112 may also be a continuous and complete curved side wall.

In one embodiment, the first side wall 112 may be perpendicular to the first bottom plate 111. The first side wall 112 and the first bottom plate 111 may be integrated.

In one embodiment, the first step 110 may be integrated with the first side wall 112. The first step 110 may be the end of the first side wall 112 away from the first bottom plate 111. The thickness of the first protrusion 1101 is smaller than the thickness of other regions of the first side wall 112. The first recess 1102 is adjacent to the first protrusion 1101.

The lower cover 11 further includes at least one positioning post 113. The positioning post 113 is extended from the first bottom plate 111 to a second bottom plate 121 of the upper cover 12. The positioning post 113 may be a wedge-shaped structure. The diameter of the cross section of the end of the positioning post 113 away from the first bottom plate 111 is smaller than the diameter of the cross section of the end of the positioning post 113 close to the first bottom plate 111.

In one embodiment, the number of the positioning posts 113 is two. The two positioning posts 113 are spaced apart at two corners of the surface of the first bottom plate 111. In one embodiment, the length of the positioning post 113 is greater than the length of the first side wall 112.

The upper cover 12 includes the second bottom plate 121 and a second side wall 122. The second side wall 122 surrounds an edge of the second bottom plate 121. A second step 120 is disposed at an end of the second side wall 122 away from the second bottom plate 121. The second step 120 includes a second protrusion 1201 and a second recess 1202. The second recess 1202 is adjacent to the second protrusion 1201. The second side wall 122 may be surrounded and formed by a plurality of sub-side walls connected in sequence. The second side wall 122 may also be a continuous and complete curved side wall.

In one embodiment, the second side wall 122 may be perpendicular to the second bottom plate 121. The second side wall 122 and the second bottom plate 121 may be integrated.

In one embodiment, the second step 120 may be integrated with the second side wall 122. The second step 120 may be the end of the second side wall 122 away from the second bottom plate 121. The thickness of the second protrusion 1201 is smaller than the thickness of other regions of the second side wall 122. The second recess 1202 is adjacent to the first protrusion 1101.

The first step 110 and the second step 120 are detachably fastened. The second protrusion 1201 is disposed inside the first recess 1102. The second protrusion 1201 is adjacent to the accommodating cavity 13.

The fixing structure 10 further includes a positioning board 14. The positioning board 14 is disposed in the accommodating cavity 13. The positioning board 14 contacts and resists the second side wall 122. The positioning board 14 is disposed between the second bottom plate 121 and the second step 120. The diameter of the positioning board 14 may be larger than the diameter of the receiving area enclosed by the second side wall 122. The positioning board 14 presses the second side wall 122 to fix the second step 120 and the first step 110.

The positioning board 14 includes at least one first positioning groove 141. The first positioning groove 141 extends from the positioning board 14 toward the first bottom plate 111. At least part of the positioning post 113 is disposed in the first positioning groove 141 and engaged with the first positioning groove 141.

In one embodiment, the central area of the first positioning groove 141 is recessed inwards, and the peripheral area of the first positioning groove 141 protrudes outwards. An end of the positioning post 113 away from the first bottom plate 111 may be disposed in the first positioning groove 141. The positioning post 113 is fixedly connected to the first positioning groove 141.

The function board 19 is disposed in the accommodating cavity 13. The function board 19 is disposed between the positioning board 14 and the lower cover 11.

In one embodiment, the function board 19 may be a circuit board. The function board 19 includes a logic circuit 192, a signal transmitting unit 193, and a control switch 194. The control switch 194 controls the logic circuit 192 to be in a corresponding working state. The logic circuit 192 controls the signal transmitting unit 193 to issue corresponding control signals respectively according to the working state.

The function board 19 has a plurality of positioning holes 191 penetrating through the board of the function board 19. The positioning post 113 passes through the positioning hole 191 and extends into the first positioning groove 141.

The remote control device 1 further includes at least one positioning bolt 18. The lower cover 11 further includes at least one second positioning groove 114.

In one embodiment, the central area of the second positioning groove 114 is recessed inwards, and the peripheral area of the second positioning groove 114 protrudes outwards. The positioning bolt 18 includes a first end 181 and a second end 182. The first end 181 passes through the positioning hole 191. The first end 181 is engaged with the second positioning groove 114. At least part of the positioning bolt 18 is disposed in the second positioning groove 114. In the direction parallel to the function board 19, the maximum width of the cross section of the second end 182 is greater than the minimum width of the cross section of the positioning hole 191. The first end 181 and the second end 182 are disposed on opposite sides of the function board 19. Since the positioning bolt 18 is fixedly connected to the positioning hole 191 and the lower cover 11, the function board 19 is fixedly connected to the lower cover 11.

The positioning board 14 and the function board 19 are arranged. The function board 19 is disposed on a side of the positioning board 14 away from the upper cover 12. The positioning board 14 includes a signal transmitting hole 142. The signal transmitting unit 193 is provided corresponding to the signal transmitting hole 142.

The positioning board 14 further includes a control hole 143. The control hole 143 penetrates the positioning board 14, and the control hole 143 is provided corresponding to the control switch 194.

The remote control device 1 further includes a control button 16. The control button 16 is disposed in the control hole 143. The control button 16 includes a third end 161 and a fourth end 162. The third end 161 is in contact with the function board 19. The third end 161 is electrically connected to the control switch 194. The fourth end 162 is in contact with the upper cover 12. The upper cover 12 includes a pressing area 125. The pressing area 125 is deformable material. The fourth end 162 is in contact with the pressing area 125. A deformable material is provided on a side of the fourth end 162 near the pressing area 125.

In one embodiment, the third end 161 is columnar. The fourth end 162 is funnel-shaped. The end of the fourth end 162 connected to the third end 161 is smaller. The end of the fourth end 162 that is directly opposite to the upper cover 12 is larger. The deformable material is in contact with the pressing area 125. Pressing the pressing area 125 can cause an elastic member 163 to change and generate an electrical signal. This electric signal is transmitted to the control switch 194. When the force is withdrawn or reduced, the elastic member 163 deforms in reverse phase. By pressing the pressing area 125, the logic circuit 192 on the function board 19 can be controlled to generate a corresponding signal, and the signal transmitting unit 193 can be further controlled to issue a corresponding control signal. The control signal may propagate outward through the control hole 143.

The positioning board 14 and the lower cover 11 cooperate with each other to accommodate and fix the function board 19. The upper cover 12 and the lower cover 11 can be quickly disassembled. Moreover, the function board 19 and the positioning board 14 will not be damaged during the disassembly process. Without affecting the basic functions of the remote control device 1, quick disassembly of the upper cover 12 can be achieved, and after disassembly, quick installation of the new upper cover 12 can also be achieved.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A remote control device comprising:
a function board, wherein the function board comprises a plurality of positioning holes and a logic circuit, a signal transmitting unit, and a control switch, the plurality of positioning holes penetrates through the function board, the function board is a circuit board, the control switch controls the logic circuit to be in a plurality of working states, the logic circuit controls the signal transmitting unit to send corresponding control signals according to each of the plurality of working states;
a fixing structure comprising:
a lower cover, wherein the lower cover comprises a first bottom plate and a first side wall, the first side wall surrounds an edge of the first bottom plate, the first side wall comprises a first step, the first step is disposed at an end of the first side wall away from the first bottom plate, the first step comprises a first protrusion and a first recess, the first recess is adjacent to the first protrusion;
an upper cover, wherein the upper cover comprises a second bottom plate and a second side wall, the second side wall surrounds an edge of the second bottom plate, the second side wall comprises a second, the second step is disposed at an end of the second side wall away from the second bottom plate, the second step comprises a second protrusion and a second recess; and
wherein the first step is detachably engaged with the second step, the second protrusion is received in the first recess;

wherein the upper cover is engaged with the lower cover to form an accommodating cavity, the second protrusion is adjacent to the accommodating cavity, the fixing structure further comprises a positioning board, the positioning board is received in the accommodating cavity, the positioning board contacts and resists the second side wall, the positioning board is disposed between the second bottom plate and the second step;

at least one positioning bolt, wherein the lower cover further comprises at least one second positioning groove, the positioning bolt comprises a first end and a second end, the first end passes through the positioning hole, the first end is engaged with the second positioning groove, at least part of the positioning bolt is received in the second positioning groove, a maximum width of a cross section of the second end is greater than a minimum width of a cross section of the positioning hole in a direction which is parallel to the function board, the first end and the second end are disposed on opposite sides of the function board; and wherein the function board is disposed in the accommodating cavity, the function board is disposed between the positioning board and the lower cover, the positioning board and the function board are oppositely arranged, the function board is disposed on a side of the positioning board away from the upper cover, the positioning board comprises a signal transmitting hole, the signal transmitting unit is provided corresponding to the signal transmitting hole.

2. The remote control device of claim 1, wherein the positioning board further comprises a control hole, the control hole penetrates the positioning board, the control hole is provided corresponding to the control switch; the remote control device further comprises a control button, the control button is disposed in the control hole, the control button comprises a third end and a fourth end, the third end is in contact with the function board, the third end is coupled to the control switch, the fourth end is in contact with the upper cover; the upper cover comprises a pressing area, a material of the pressing area is deformable material, the fourth end is in contact with the pressing area, a material of a side of the fourth end near the pressing area is deformable material.

3. A remote control device comprising:
 a function board, wherein the function board comprises a plurality of positioning holes and a logic circuit, a signal transmitting unit, and a control switch, the plurality of positioning holes penetrates through the function board, the function board is a circuit board, the control switch controls the logic circuit to be in a plurality of working states, the logic circuit controls the signal transmitting unit to send corresponding control signals according to each of the plurality of working states;
 a fixing structure comprising:
  a lower cover, wherein the lower cover comprises a first bottom plate and a first side wall, the first side wall surrounds an edge of the first bottom plate, the first side wall comprises a first step, the first step is disposed at an end of the first side wall away from the first bottom plate, the first step comprises a first protrusion and a first recess, the first recess is adjacent to the first protrusion;
  an upper cover, wherein the upper cover comprises a second bottom plate and a second side wall, the second side wall surrounds an edge of the second bottom plate, the second side wall comprises a second, the second step is disposed at an end of the second side wall away from the second bottom plate, the second step comprises a second protrusion and a second recess; and wherein the first step is detachably engaged with the second step, the second protrusion is received in the first recess;

wherein the upper cover is engaged with the lower cover to form an accommodating cavity, the second protrusion is adjacent to the accommodating cavity, the fixing structure further comprises a positioning board, the positioning board is received in the accommodating cavity, the positioning board contacts and resists the second side wall, the positioning board is disposed between the second bottom plate and the second step;

at least one positioning bolt, wherein the lower cover further comprises at least one second positioning groove, the positioning bolt comprises a first end and a second end, the first end passes through the positioning hole, the first end is engaged with the second positioning groove, at least part of the positioning bolt is received in the second positioning groove, a maximum width of a cross section of the second end is greater than a minimum width of a cross section of the positioning hole in a direction which is parallel to the function board, the first end and the second end are disposed on opposite sides of the function board;

wherein the function board is disposed in the accommodating cavity, the function board is disposed between the positioning board and the lower cover, the positioning board and the function board are oppositely arranged, the function board is disposed on a side of the positioning board away from the upper cover, the positioning board comprises a signal transmitting hole, the signal transmitting unit is provided corresponding to the signal transmitting hole;

wherein the lower cover further comprises at least one positioning post, at least one positioning post extends from the first bottom plate toward the second bottom plate, at least one positioning post passes through the positioning hole and extends into the first positioning groove; and wherein the positioning board comprises at least one first positioning groove, the first positioning groove extends from the positioning board toward the first bottom plate, at least part of at least one positioning post is received in the first positioning groove and engaged with the first positioning groove.

4. The remote control device of claim 3, wherein the positioning board further comprises a control hole, the control hole penetrates the positioning board, the control hole is provided corresponding to the control switch; the remote control device further comprises a control button, the control button is disposed in the control hole, the control button comprises a third end and a fourth end, the third end is in contact with the function board, the third end is coupled to the control switch, the fourth end is in contact with the upper cover; the upper cover comprises a pressing area, a material of the pressing area is deformable material, the fourth end is in contact with the pressing area, a material of a side of the fourth end near the pressing area is deformable material.

* * * * *